United States Patent [19]

Chi

[11] Patent Number: 5,350,662
[45] Date of Patent: Sep. 27, 1994

[54] MASKLESS PROCESS FOR FORMING REFRACTORY METAL LAYER IN VIA HOLES OF GAAS CHIPS

[75] Inventor: Tom Y. Chi, San Gabriel, Calif.

[73] Assignee: Hughes Aircraft Company, Los Angeles, Calif.

[21] Appl. No.: 181,371

[22] Filed: Jan. 13, 1994

Related U.S. Application Data

[63] Continuation of Ser. No. 857,902, Mar. 26, 1992, abandoned.

[51] Int. Cl.$^5$ ............................................... G03F 7/20
[52] U.S. Cl. ................... 430/313; 430/311; 430/318; 430/329; 156/656; 156/659.1; 427/512
[58] Field of Search ............... 430/311, 313, 314, 318, 430/319, 323, 327, 329; 156/643, 656, 659.1; 427/508, 512

[56] References Cited

U.S. PATENT DOCUMENTS

| | | | |
|---|---|---|---|
| 4,268,537 | 5/1981 | Goodman | 430/318 |
| 4,983,252 | 1/1991 | Masui | 430/318 |

Primary Examiner—Marion E. McCamish
Assistant Examiner—Kathleen Duda
Attorney, Agent, or Firm—Georgann S. Grunebach; Terje Gudmestad; W. K. Denson-Low

[57] ABSTRACT

A "maskless" process is provided for the formation of a refractory metal layer (22b), such as titanium, in via holes (18) through GaAs wafers (12) to contact microwave monolithic integrated circuit (MMIC) devices (10) formed on the front surface (12a) thereof. The process of the invention, which prevents AuSn solder (28) from filling up the holes during a subsequent eutectic AuSn bonding of the device to a metal carrier (30), such as molybdenum, utilizes the difference of resist thickness on the GaAs backside surface (12b) and in the via holes, so that the resist (24b) remaining in the via holes after removing the resist (24a) over the GaAs back surface serves as a mask in etching the refractory metal layer (22a) over the GaAs back surface. The process of the invention does not require any masks, and results in self-alignment of the refractory metal to the via hole. The process is simple and results in high yield of the MMIC devices on GaAs chips (26).

12 Claims, 2 Drawing Sheets

MASKLESS PROCESS FOR FORMING REFRACTORY METAL LAYER IN VIA HOLES OF GAAS CHIPS

RELATED APPLICATION

This application is a continuation of Ser. No. 07/857,902 filed Mar. 26, 1992 now abandoned.

BACKGROUND OF THE INVENTION

1. Field of the Invention

The present invention relates to the fabrication of gallium arsenide (GaAs) microwave monolithic integrated circuits (MMIC), and, more particularly, to forming metal contact layers in via holes in such devices.

2. Description of Related Art

During the fabrication of GaAs MMIC devices, via holes are formed on the backside of the GaAs wafer and extending through to the frontside of the wafer, which is secured to a mounting substrate. A metal, typically a titanium/platinum/gold multilayer structure, is blanket-deposited on the backside of the wafer and through the via holes, to make contact with the MMIC devices, which are formed on the frontside of the GaAs wafer.

After testing, each MMIC device is separated from the others by dicing, and each device is mounted on metal carriers, such as molybdenum, using a gold-tin (AuSn) eutectic bonding process. However, a problem with the bonding process is that the AuSn liquid solder has a tendency to fill up the via holes during the bonding process, which results in cracking of the via holes and tin migration through the via holes upon cooling of the AuSn solder. The cracking and tin migration degrades reliability and reduces yield of these GaAs MMIC devices significantly. Indeed, losses approaching 40% are not uncommon.

Thus, a need remains for a process for forming metal contacts in via holes while preventing filling of the via holes by AuSn solder during the eutectic AuSn bonding process.

SUMMARY OF THE INVENTION

In accordance with the invention, a "maskless" process is provided for the formation of a refractory metal layer in via holes to prevent AuSn solder from filling up the holes during eutectic AuSn bonding. The refractory metal is not wet by the AuSn solder, and hence no solder enters the via holes.

The process of the invention comprises forming the refractory metal layer on the multilayer metal structure on the backside of the GaAs wafer, and then forming a resist layer on the refractory metal layer, including filling the via holes. The resist layer is baked and then blanket exposed by UV light, without the use of a mask. Next, the resist is developed to remove those portions of resist lying over the backside of the GaAs wafer. Since the resist thickness on the surface of the GaAs wafer is considerably less than that of the resist in the via holes, then the resist over the surface is removed, with substantially no removal of the resist from the via holes. The exposed refractory metal portions lying on the surface of the wafer are next removed. Finally, the resist is stripped from the via holes, leaving the refractory metal lining the via holes. The resulting structure is also novel.

The maskless process of the invention utilizes the difference of resist thickness on the GaAs backside surface and in the via holes, so that the resist remaining in the via holes after removing the resist over the GaAs surface serves to protect the refractory metal lining the via holes while the refractory metal layer over the GaAs surface is removed. The process of the invention does not require any masks, and results in self-alignment of the refractory metal lining the via hole to the via hole. The process is simple and results in high yield of the MMIC devices.

DESCRIPTION OF THE PREFERRED EMBODIMENTS

Microwave monolithic integrated circuit (MMIC) devices and amplifiers are formed on the front surface of a GaAs wafer and are contacted from the backside of the wafer through metal-lined via holes which extend from the back surface to the front surface of the wafer. After dicing the wafer into chips carrying the MMIC devices, the chips are then mounted on metal carriers, employing AuSn solder during eutectic AuSn bonding. The purpose of this invention is to provide a simple and consistent process for forming a metal contact in the via holes which is not wet by the AuSn solder, so that AuSn solder will not fill up the via holes during the eutectic bonding process, yet remain available for heat-sinking the MMIC devices.

Figure 1:
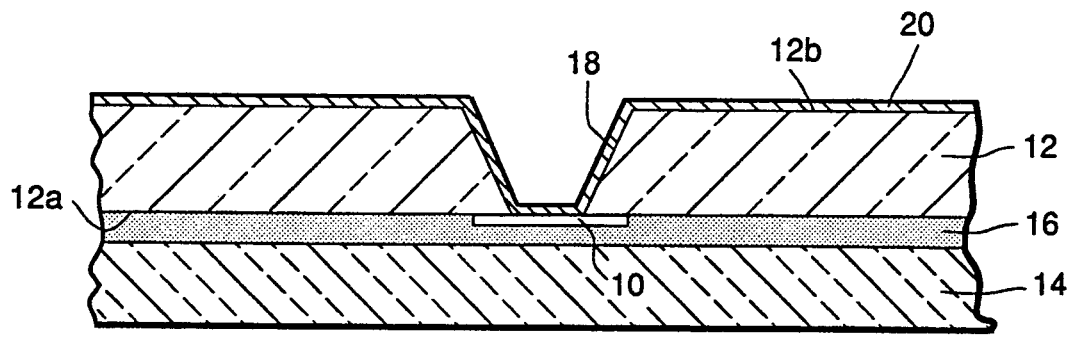
FIG. 1 depicts a structure which is conventional in the art.

In present practice, MMIC devices 10 are formed on the frontside 12a of a GaAs wafer 12, as shown in FIG. 1. The fabrication of MMIC devices and amplifiers 10 and the like forms no part of this invention.

In order to make contact to the MMIC devices 10, the GaAs wafer 12 is mounted on a mounting substrate 14, such as glass, quartz, or sapphire, using a mounting wax 16. The mounting substrate 14 and mounting wax 16 are wellknown in the prior art and form no part of this invention.

The GaAs wafer 12 is thinned, using conventional thinning techniques, to reduces its thickness for better thermal dissipation of heat from the chips. The via holes 18 are formed from the backside 12b of the wafer 12 through to the frontside 12a, employing well-known etching procedures. The via holes 18 are typically about 50 to 100 $\mu$m deep.

A metal layer 20 is next deposited on the backside 12b of the wafer and in the via holes. The metal layer 20 typically comprises a titanium/platinum/gold multilayer structure, in which titanium is used as an adhesion layer and is about 500 Å thick, platinum is used as a barrier layer and is about 1,000 Å thick, and gold is used as a contact layer and is about 0.5 to 3 $\mu$m thick. The deposition of the metal layer 20 is conventional and forms no part of this invention.

At this stage in the process, the wafer 12 is removed from the mounting substrate 14 and the MMIC devices 10 are tested. The wafer 12 is then diced to form chips (not shown in FIG. 1) so that each MMIC device 10 is separated from each of the other devices, and those devices that passed testing are mounted on a metal carrier (not shown in FIG. 1), using AuSn solder. This is a eutectic bonding process, employing molten metal to contact the exposed gold surface of the metal layer 20.

It is at this stage that yields fall drastically, due to the incursion of AuSn into the via holes 18 and causing the problems described above.

Figure 2:
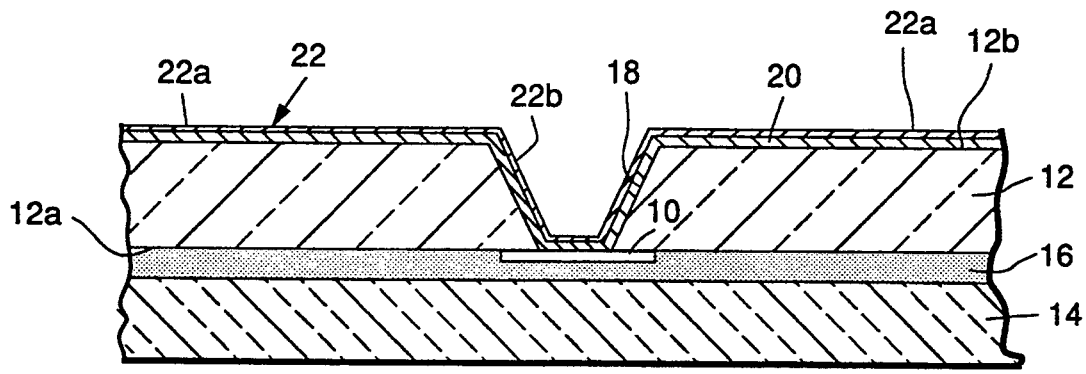
FIGS. 2–6 depict the resulting structures at various stages of the process of the invention.

In accordance with the invention, after forming the metal layer 20, and prior to removal of the wafer 12 from the mounting substrate 14, a refractory metal layer 22 is formed in the via holes 18, as shown in FIG. 2. Examples of suitable refractory metals include titanium, tungsten, and tantalum, and alloys thereof, such as titanium-tungsten. Preferably, titanium is employed, since it is already well-characterized for use in GaAs technology.

The thickness of the refractory metal layer 22 ranges from about 100 to 2,000 Å. At least about 100 Å ensures that no AuSn alloy will intrude into the via hole, while more that about 2,000 Å takes longer to deposit and to subsequently etch away and thus is not economical. Preferably, about 500 to 2,000 Å of titanium is employed, and most preferably about 1,000 Å of titanium is used. Deposition is most conveniently done by sputtering, although other deposition procedures may alternatively be employed.

The formation of the refractory metal layer 22 is essential to achieving high yield and good reliability of the GaAs MMIC devices, because the AuSn does not wet refractory metals and thus cannot fill the via holes 18.

The refractory metal 22 is blanket-deposited over the metal layer 20 on the back surface 12b of the wafer 12, including in the via holes 18, as shown in FIG. 2. Those portions of the refractory metal overlying the back surface of the wafer are denoted as 22a, while those portions in the via holes are denoted as 22b.

Figure 3:
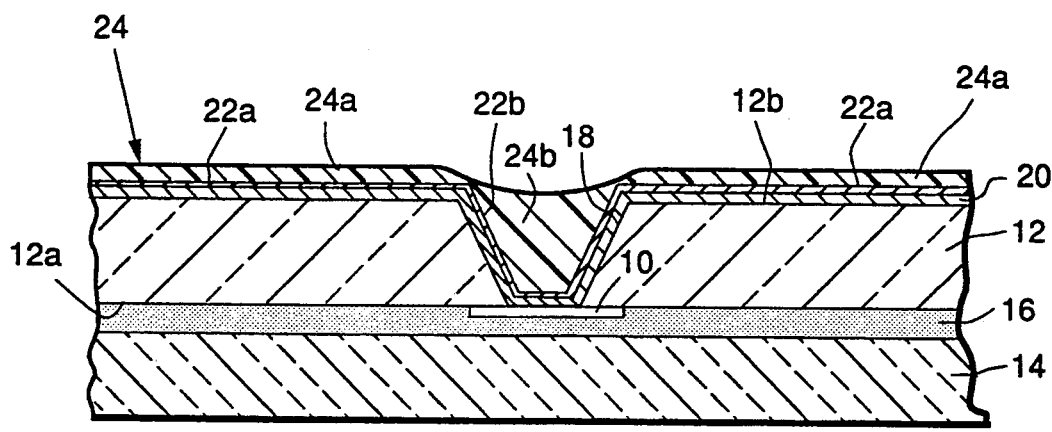

A resist layer 24 is then formed on the backside of the GaAs wafer 12 over the refractory metal layer 22 and in the via holes 18, as shown in FIG. 3. Any of the positive resist materials commonly employed in the fabrication of GaAs devices may be suitably employed in the practice of the invention; an example includes Shipley AZ 137C. The resist layer is formed to a thickness of about 0.5 to 5 $\mu$m, and conveniently to about 1 $\mu$m.

The resist layer 24 is then baked, employing processing conditions that are conventional in the art. For example, a hot plate bake at 100° C. may be done for 60 seconds. Alternatively, an oven bake at 90° C. may be done for 30 minutes.

Figure 4:
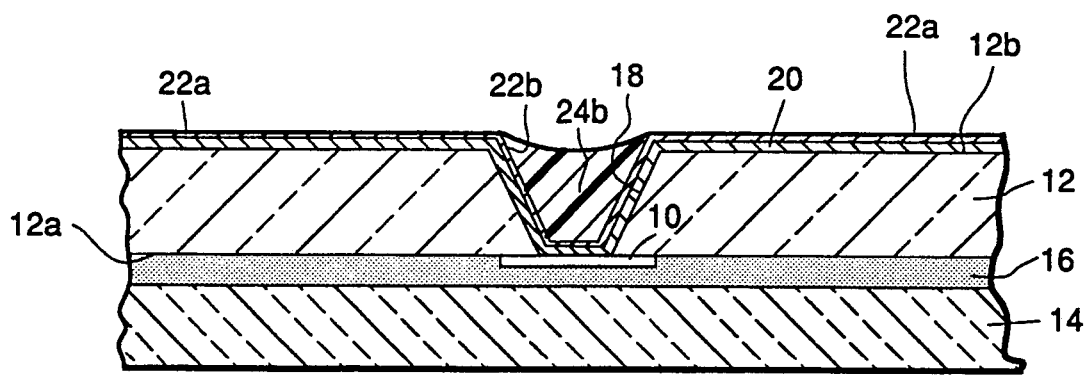

The entire resist layer 24 is then exposed to ultraviolet (UV) light, using no masks. The resist is developed to remove the resist 24a on the GaAs surface. The resulting structure is shown in FIG. 4, which depicts the portion of the resist 24b remaining in the via holes 18.

In practicing the process of the invention, the difference between the resist thickness over the surface of the GaAs wafer 12 and the resist thickness in the via holes 18 is relied upon. This difference is considerable, since the thickness of the resist layer 24a on the surface is about 1 $\mu$m, while the thickness of the resist layer 24b in the via holes 18 is about 50 $\mu$m.

Thus, the resist 24a on the surface, being thinner, is removed, leaving the resist 24b in the via holes 18. While some resist is lost from the via holes 18, this loss is essentially inconsequential. The resist 24b in the via holes 18 serves as a mask in etching the refractory metal layer 22. Thus, it will be appreciated that the process of the invention does not require a patterning mask for the photoresist and is essentially self-aligned. Because of the difference between the two thicknesses of resist portions 24a and 24b, there is enough resist in the via holes 18 to protect the refractory metal layer 22b lining the via holes.

Any of the common developers used in the art may be employed. For example, aqueous solutions of NaOH or KOH may be used, as is well-known.

Figure 5:
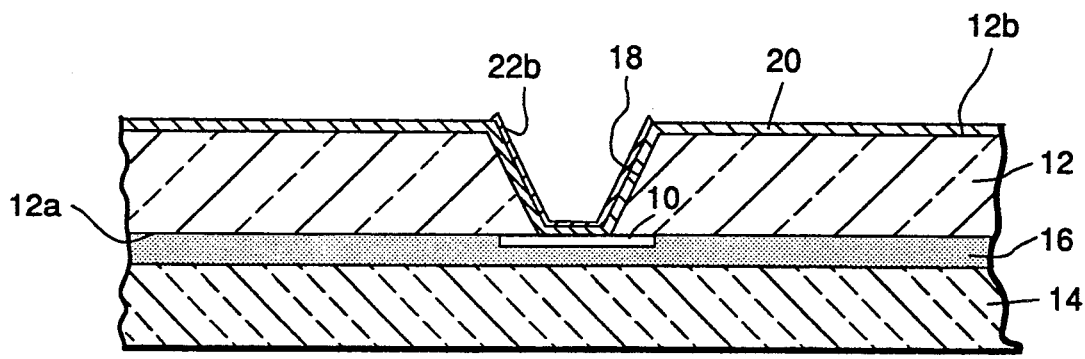

The exposed portions 22a of the refractory metal layer 22 are etched away, such as by conventional chemical etching or plasma etching, leaving only those portions 22b lining the via holes 18. The remaining resist 24b is then stripped from the via holes 18, leaving the structure shown in FIG. 5, where the refractory metal layer 22b lines the via holes 18.

Figure 6:
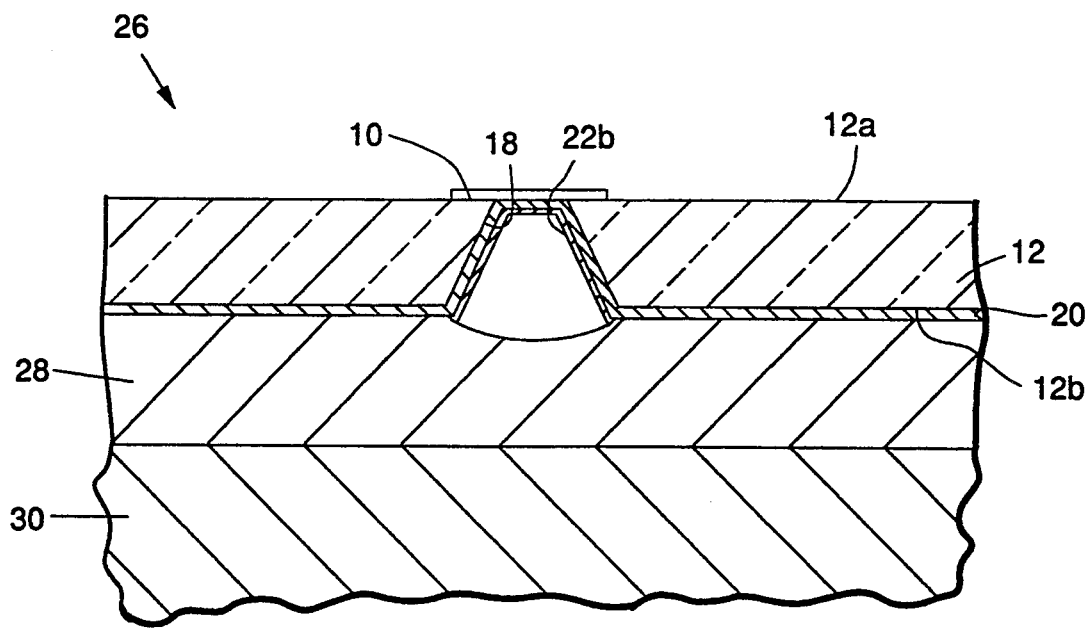

The eutectic AuSn bonding process may now be employed, following the removal of the wafer 12 from the mounting substrate 14, testing of the MMIC devices 10, and dicing the wafer. FIG. 6 depicts a chip 26 on which an AuSn layer 28 has been formed to bond the chip to a metal carrier 30. The thickness of the eutectic AuSn layer 28 is typically about 10 to 20 $\mu$m, and generally about 12 $\mu$m. As can be seen in FIG. 6, the presence of the refractory metal layer 22b lining the via hole 18 prevents intrusion of AuSn solder 28 thereinto.

While a mask step could be interposed between the baking and the exposure to UV radiation, such a step provides several disadvantages, including requiring an extra process step, and requiring a mask in which the refractory metal 22b remaining after patterning would extend some distance beyond the via holes 18. This latter requirement is a result of potential mis-alignment between the mask and the via holes, and thus dictates the width of the final refractory metal 22b remaining to accommodate the maximum mis-alignment possible. Since AuSn does not wet the refractory metal, it is thereby formed some distance from the via hole 18, and thus cannot efficiently perform its intended function of conducting heat generated by the MMIC device 10 away from the device.

The major disadvantages of a mask process are (1) any mask process on the backside of the thinned GaAs wafer after via hole formation reduces yield significantly; (2) the refractory metal layer defined around the via holes varies with the actual size of the via holes; and (3) such a process requires an additional mask and would always have mis-alignment in the patterning process.

The "maskless" process of the invention results in self-alignment of the refractory metal layer 22b with the via hole 18 and prevents AuSn solder from filling up the holes during eutectic AuSn bonding, since the AuSn does not wet the refractory metal. It is a simple process and results in high yield of the MMIC devices. Indeed, in contrast to the prior art results approaching 40% losses, less than 1% losses have been observed after processing over 20,000 chips.

The advantages of the invention are:
(1) The process of the invention is very simple as compared to a process requiring a mask layer in patterning the refractory metal layer on the GaAs surface. Patterning on the backside of a thinned GaAs wafer is a time-consuming and low-yield process. This low-yield process is eliminated by using the maskless process of the invention.
(2) The process of the invention offers consistent results by a self-aligned refractory metal layer formed in the via holes. Since there is no mask involved, it may be considered to be a self-aligned process.

(3) Since a reduction in losses from 40% to less than 1% is achieved by the process of the invention, the additional process steps of the invention are readily justified.

Thus, there has been disclosed an improved process for bonding MMIC devices formed on the front surfaces of GaAs chips from the backside thereof. It will be readily apparent to one skilled in the art that various changes and modifications of an obvious nature may be made without departing from the spirit of the invention, and all such changes and modifications are considered to fall within the scope of the invention, as defined by the appended claims.

What is claimed is:

1. A method for providing contacts to microwave monolithic integrated circuit devices formed on a gallium arsenide wafer, said gallium arsenide wafer having a front and a back surface wherein (1) at least one via hole is formed from said back surface of said wafer through to said front surface of said wafer to expose a portion of each said device, (2) a metal layer is formed on said back surface and in each of said via holes, thereinto (3), each of said devices subsequently bonded to a metal carrier using a AuSn solder alloy, contacting said portion of each said device, said method comprising the steps of:
   (a) forming a layer of a refractory metal lining each of said via holes,
   (b) blanket-depositing a layer of said refractory metal on said metal layer, including in said via holes;
   (c) forming a positive resist layer on said refractory metal layer and filling said via holes with said resist layer;
   (d) baking said resist layer;
   (e) exposing all of said resist layer to ultraviolet radiation in the absence of any mask layer;
   (f) developing said resist layer to remove all of said resist layer lying over said back surface, leaving said resist layer in said via holes to thereby uncover portions of said refractory metal layer over said back surface;
   (g) removing said uncovered portions of refractory metal over said back surface; and
   (h) removing said resist layer remaining in said via holes, leaving said refractory metal lining said via holes, wherein said refractory metal layer is selfaligned to said via holes to prevent the intrusion of said AuSn solder.

2. The method of claim 1 wherein said metal layer comprises a multilayer structure consisting of a first layer of titanium formed on said gallium arsenide back surface, a second layer of platinum formed on said first layer of titanium, and a third layer of gold formed on said second layer of platinum.

3. The method of claim 1 wherein said refractory metal comprises a metal selected from the group consisting of titanium, tungsten, tantalum, and alloys thereof.

4. The method of claim 3 wherein said refractory metal is deposited to a thickness ranging from about 100 to 2,000 Å.

5. The method of claim 3 wherein said refractory metal consists essentially of titanium formed to a thickness of about 500 to 2,000 Å.

6. The method of claim 5 wherein said thickness is about 1,000 Å.

7. The method of claim 1 wherein said resist is deposited to a thickness of about 1 $\mu$m over the back surface of said gallium arsenide wafer and said via hole is about 50 to 100 $\mu$m in depth.

8. The method of claim 1 wherein said wafer is subsequently diced into chips, each chip carrying at least one of said microwave monolithic integrated circuit devices, and each said chip is mounted on said metal carrier using eutectic gold-tin solder.

9. A process for providing contacts to microwave monolithic integrated circuit devices formed on a gallium arsenide wafer, said gallium arsenide wafer having a front surface and a back surface wherein (1) at least one via hole is formed from said back surface of said wafer through to said front surface to expose a portion of each said device, (2) a metal layer consisting essentially of a titanium/platinum/gold multistructure is formed on said back surface and in each of said via holes, contacting said portion of said device, and (3) each said device is subsequently bonded to a metal carrier using a AuSn solder alloy, wherein said process comprises, prior to step (3):
   (a) blanket-depositing a layer of titanium ranging from about 500 to 1,000 Å in thickness on said metal layer, including in said via holes;
   (b) forming a positive resist layer on said titanium layer and filling said via holes;
   (c) baking said resist layer;
   (d) exposing all of said resist layer to ultraviolet radiation in the absence of any mask layer;
   (e) developing said resist to remove all resist lying over said back surface but leaving resist in said via holes to thereby uncover portions of said titanium layer over said back surface;
   (f) removing said uncovered portions of titanium over said back surface; and
   (g) removing said resist remaining in said via holes, leaving said titanium lining said via holes, wherein said titanium layer is self-aligned to said via hole to prevent the intrusion of said AuSn solder thereinto.

10. The process of claim 9 wherein said thickness of said titanium layer is about 1,000 Å.

11. The process of claim 9 wherein said resist is deposited to a thickness of about 0.5 to 5 $\mu$m over the back surface of said gallium arsenide wafer and said via hole is about 50 to 100 $\mu$m in depth.

12. The process of claim 9 wherein said wafer is subsequently diced into chips, each chip carrying at least one of said microwave monolithic integrated circuit devices, and each said chip is mounted on said metal carrier using eutectic gold-tin solder.

* * * * *